(12) United States Patent
Tomoda et al.

(10) Patent No.: US 8,564,290 B2
(45) Date of Patent: Oct. 22, 2013

(54) MAGNETIC RESONANCE IMAGING APPARATUS AND METHOD

(75) Inventors: Yoshihiro Tomoda, Tokyo (JP); Yuji Iwadate, Tokyo (JP)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 403 days.

(21) Appl. No.: 12/893,928

(22) Filed: Sep. 29, 2010

(65) Prior Publication Data
US 2011/0074411 A1    Mar. 31, 2011

(30) Foreign Application Priority Data

Sep. 30, 2009   (JP) ................... 2009-228559

(51) Int. Cl.
*G01V 3/00*    (2006.01)
(52) U.S. Cl.
USPC .......................................... 324/309; 324/306
(58) Field of Classification Search
USPC ................... 324/309, 306, 307; 600/410
See application file for complete search history.

(56) References Cited

U.S. PATENT DOCUMENTS

| | | | |
|---|---|---|---|
| 5,382,902 A * | 1/1995 | Taniguchi et al. | 324/309 |
| 5,539,312 A * | 7/1996 | Fu et al. | 324/309 |
| 5,800,354 A * | 9/1998 | Hofland et al. | 600/410 |
| 6,617,850 B2 * | 9/2003 | Welch et al. | 324/309 |
| 6,771,998 B2 * | 8/2004 | Kirsch | 600/410 |
| 7,254,437 B2 | 8/2007 | Miyazaki | |
| 2007/0205769 A1 | 9/2007 | Yui et al. | |
| 2009/0018433 A1 | 1/2009 | Kassai et al. | |

FOREIGN PATENT DOCUMENTS

| | | |
|---|---|---|
| JP | 05-305063 | 11/1993 |
| JP | 06047021 | 2/1994 |
| JP | 2009-034485 | 2/2009 |

OTHER PUBLICATIONS

Japanese Office Action; Application No. 2009-228559; dated Oct. 11, 2011; pp. 2.

* cited by examiner

*Primary Examiner* — Louis Arana
(74) *Attorney, Agent, or Firm* — Armstrong Teasdale LLP

(57) ABSTRACT

A magnetic resonance imaging apparatus for acquiring k-space data from a deformable imaging region of a subject and generating image data of the imaging region at the time of being deformed to a predetermined state, based on the acquired k-space data, includes a gradient coil for applying a gradient magnetic field in a phase encoding direction, and an image data calculation device for calculating a numeric value for defining a relationship between the imaging region at the time of being deformed to the predetermined state and the imaging region at an nth phase encoding and calculating image data of the imaging region at the time of being deformed to the predetermined state, based on the calculated numeric value and the k-space data acquired from the imaging region.

20 Claims, 14 Drawing Sheets

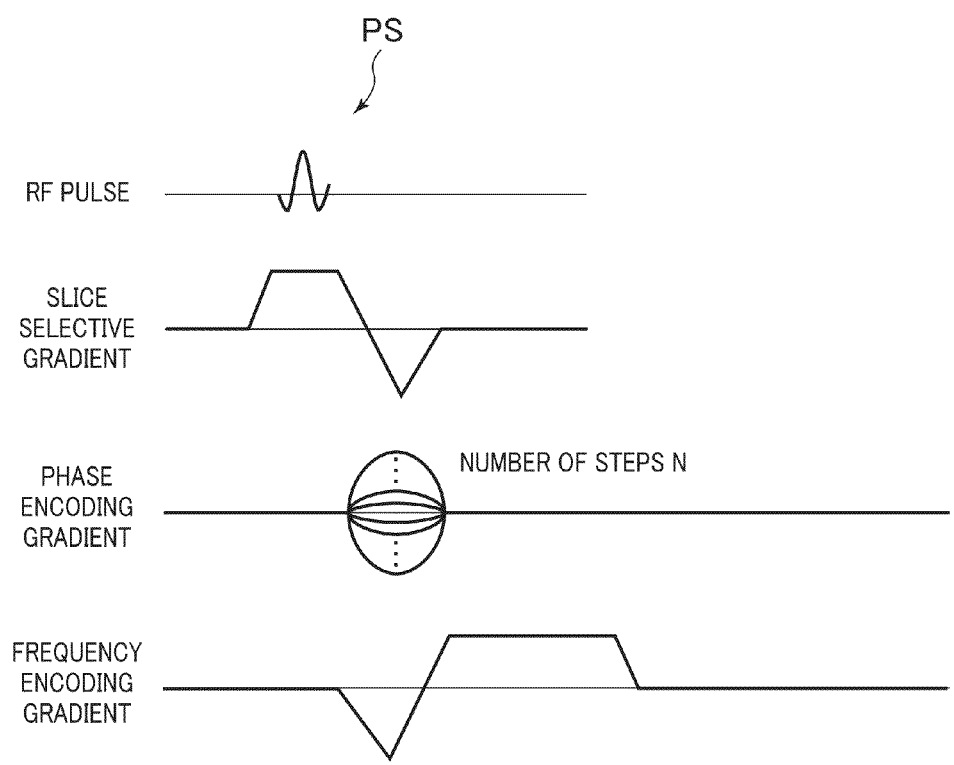

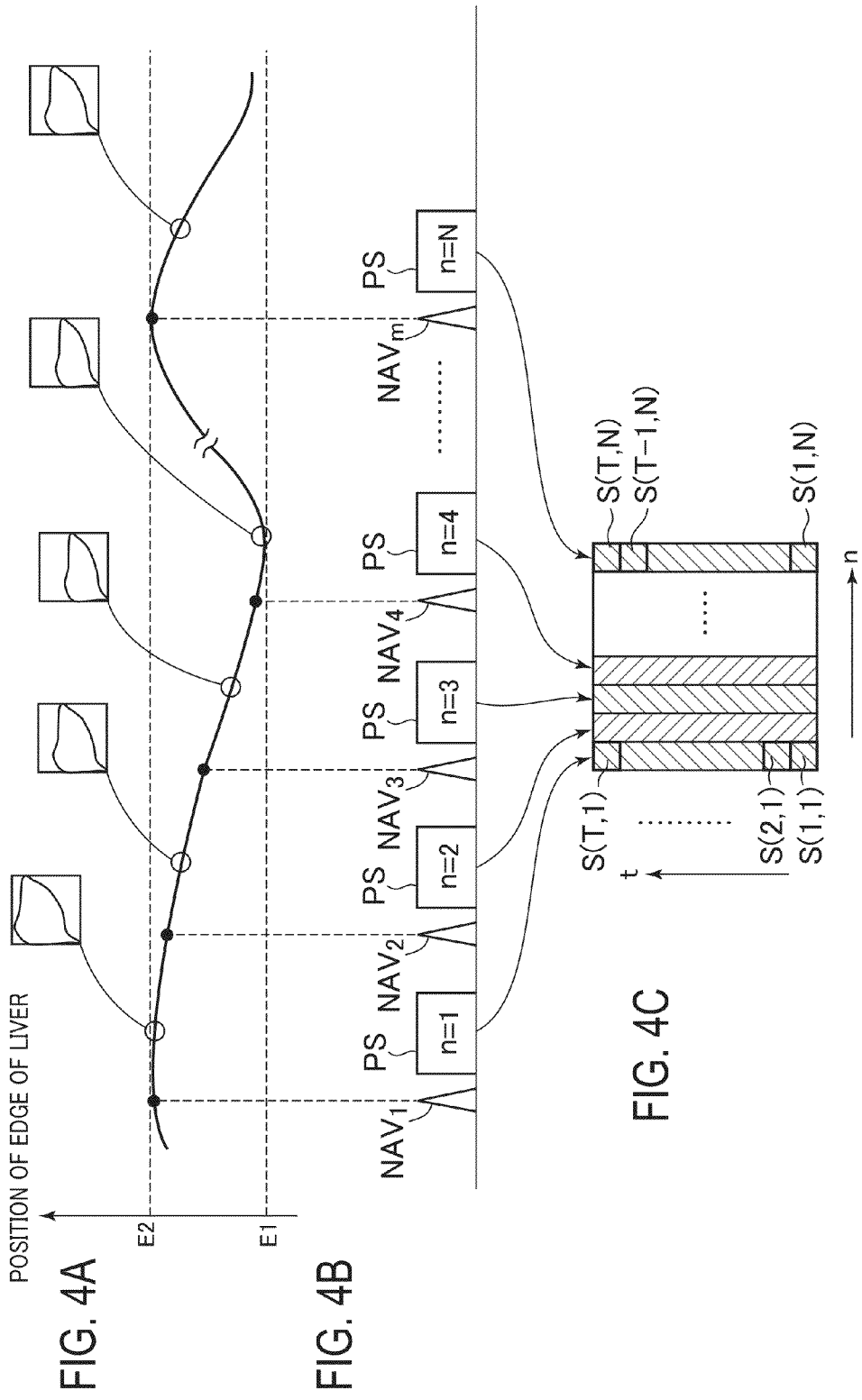

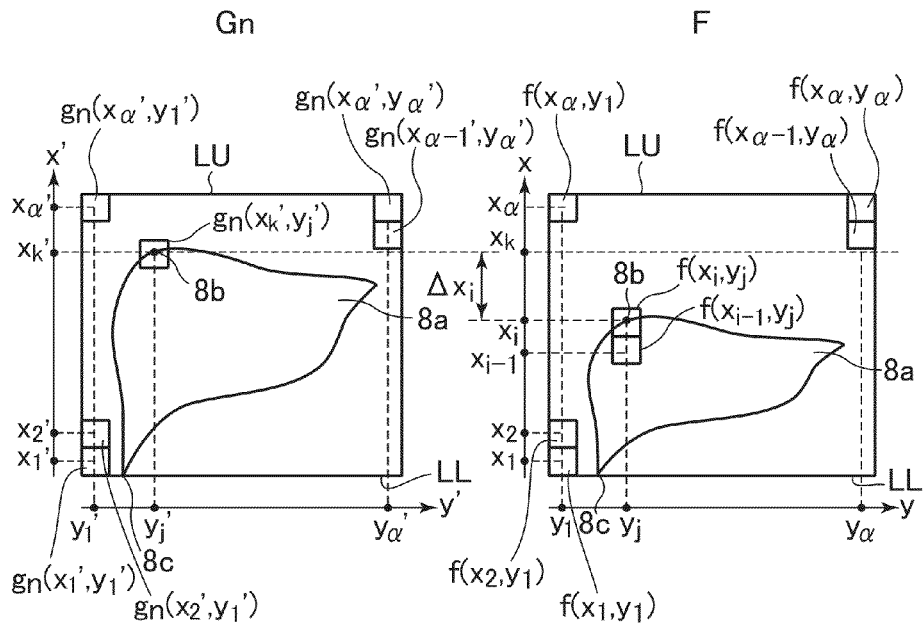

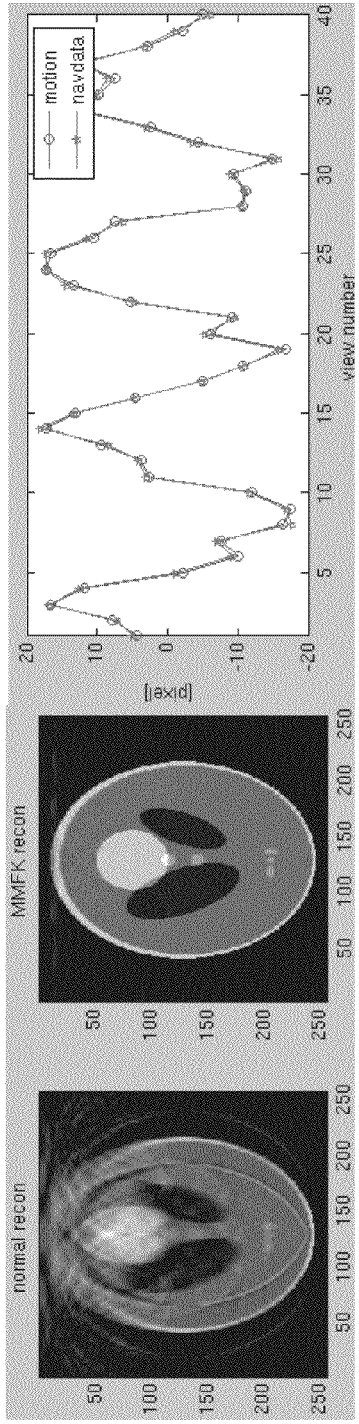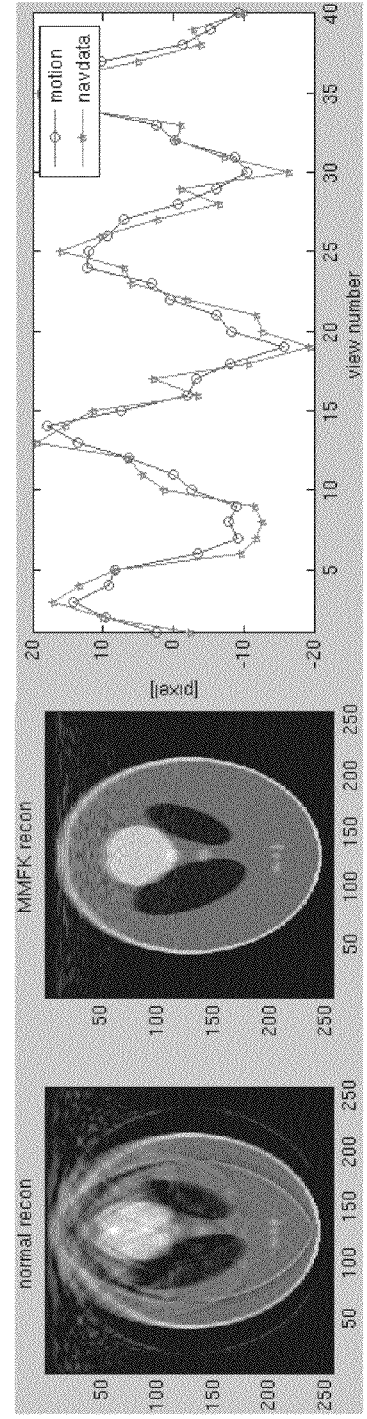
FIG. 12A
FIG. 12B

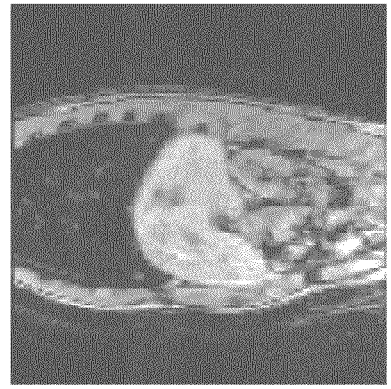
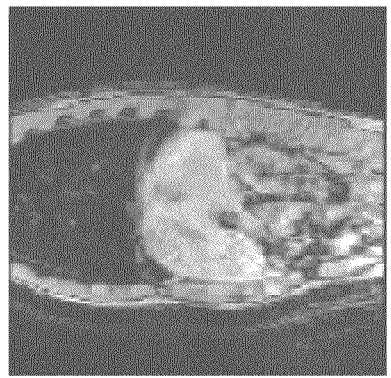
FIG. 13A
FIG. 13B

MAGNETIC RESONANCE IMAGING APPARATUS AND METHOD

CROSS REFERENCE TO RELATED APPLICATIONS

This application claims the benefit of Japanese Patent Application No. 2009-228559 filed Sep. 30, 2009, which is hereby incorporated by reference in its entirety.

BACKGROUND OF THE INVENTION

The present invention relates to a magnetic resonance imaging apparatus for correcting body motion.

There is a case where in order to reduce body-motion artifacts due to the respiration of a patient, a breath-holding instruction is given to the patient and the patient is imaged while holding his/her breath. The present method is, however, not capable of reducing the body-motion artifacts sufficiently with respect to the patient difficult to hold his/her breath. There is therefore known a method for performing imaging by a respiratory gating method (refer to Japanese Unexamined Patent Publication No. 2009-034485).

PRIOR ART DOCUMENT

Patent Document 1 Japanese Unexamined Patent Publication No. 2009-034485

In the above-described method, in order to reduce the body-motion artifacts, data are acquired when breathing is stable. Thus, a problem arises in that data cannot be acquired until the breathing is stabilized again after the data have been acquired while the breathing is stable, so that an imaging time becomes longer.

It is desirable that the problem described previously is solved.

BRIEF DESCRIPTION OF THE INVENTION

An aspect of the invention is a magnetic resonance imaging apparatus for acquiring k-space data from a deformable imaging region of a subject and generating image data of the imaging region at the time of being deformed to a predetermined state, based on the acquired k-space data, including: a gradient coil for applying a gradient magnetic field in a phase encoding direction; and an image data calculation device for calculating a numeric value for defining a relationship between the imaging region at the time of being deformed to the predetermined state and the imaging region at an n (where n=integers of 1 to N)th phase encoding and calculating image data of the imaging region at the time of being deformed to the predetermined state, based on the calculated numeric value and the k-space data acquired from the imaging region.

In the invention, the numeric value for defining the relationship between the imaging region at the time of being deformed to the predetermined state and the imaging region at the n (where n=integers of 1 to N)th phase encoding is calculated. The image data of the imaging region at the time of being deformed to the predetermined state is calculated based on the calculated numeric value and the k-space data acquired from the imaging region. Thus, since image data at the time that an imaging region is deformed to a predetermined state can be calculated without waiting for deformation of the imaging region to the predetermined state, the shortening of an imaging time interval can be achieved.

Further objects and advantages of the present invention will be apparent from the following description of the preferred embodiments of the invention as illustrated in the accompanying drawings.

BRIEF DESCRIPTION OF THE DRAWINGS

FIG. 3 is a diagram showing one example of an imaging sequence used to acquire data in a k space from a subject 8.

FIGS. 4A, 4B, and 4C are diagrams for explaining how to execute a navigator sequence NAV and an imaging sequence PS.

FIGS. 5A and 5B are diagrams showing deformed states of a region to be imaged.

FIGS. 12A and 12B are diagrams showing simulation results.

FIGS. 13A and 13B are diagrams illustrating MR images of a liver 8a of a subject.

DETAILED DESCRIPTION OF THE INVENTION

Although a preferred embodiment of the invention will be explained below, the invention is not limited to the following embodiment.

Figure 1:
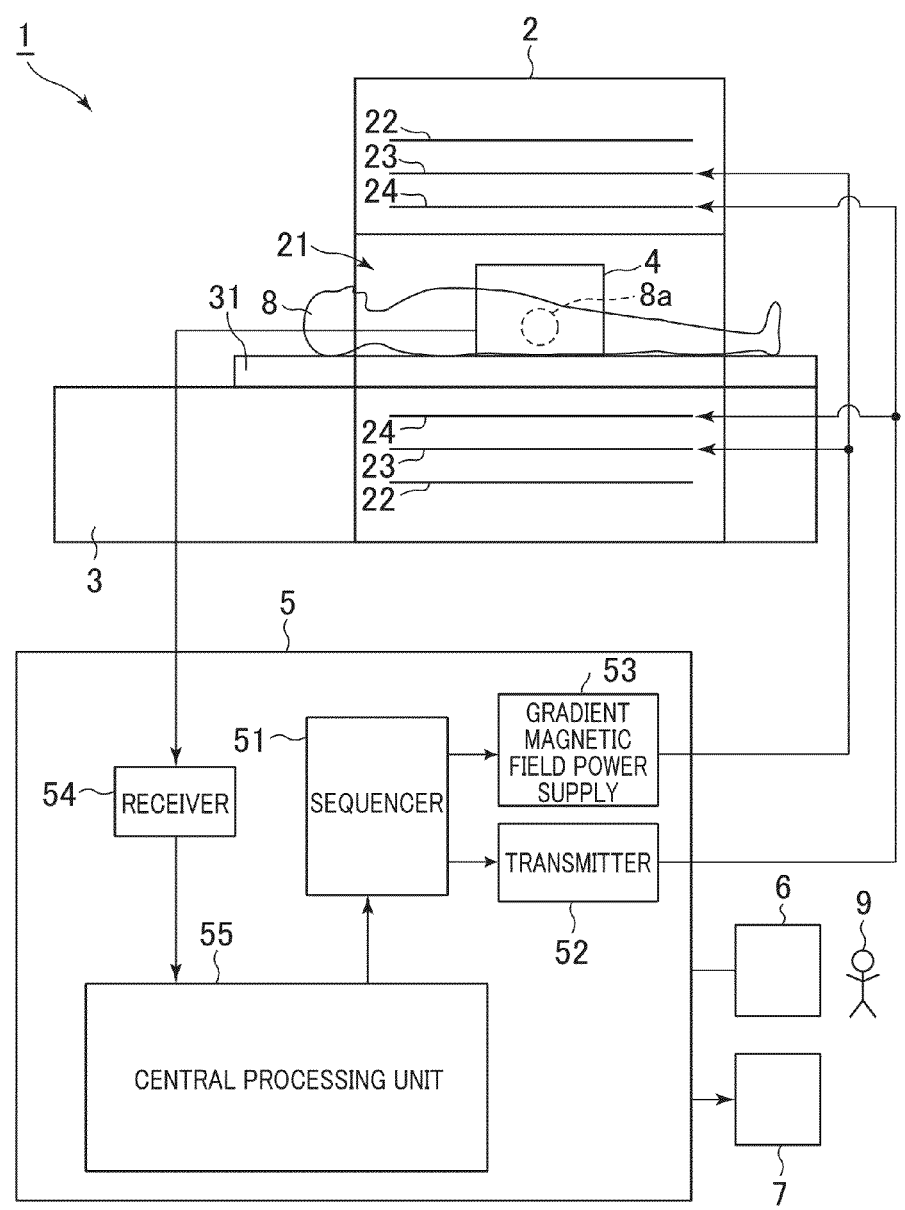
FIG. 1 is a diagram showing a magnetic resonance imaging apparatus 1 according to one embodiment of the invention.

FIG. 1 is a diagram showing a magnetic resonance imaging apparatus 1 according to one embodiment of the invention.

The magnetic resonance imaging apparatus 1 has a coil assembly 2, a table 3, a receiving coil 4, a control device 5, an input device 6 and a display device 7.

The coil assembly 2 has a bore 21 in which a subject 8 is held, a superconductive coil 22, a gradient coil 23 and a transmitting coil 24. The superconductive coil 22 applies a static magnetic field B0, and the gradient coil 23 applies a gradient magnetic field in a frequency encoding direction and a phase encoding direction. The transmitting coil 24 transmits an RF pulse. Incidentally, although the superconductive coil 22 is used in the present embodiment, a permanent magnet may be used instead of the superconductive coil 22.

The table 3 has a cradle 31 for conveying the subject 8. The subject 8 is conveyed to the bore 21 by the cradle 31.

The receiving coil 4 is attached to the subject 8.

Figure 2:
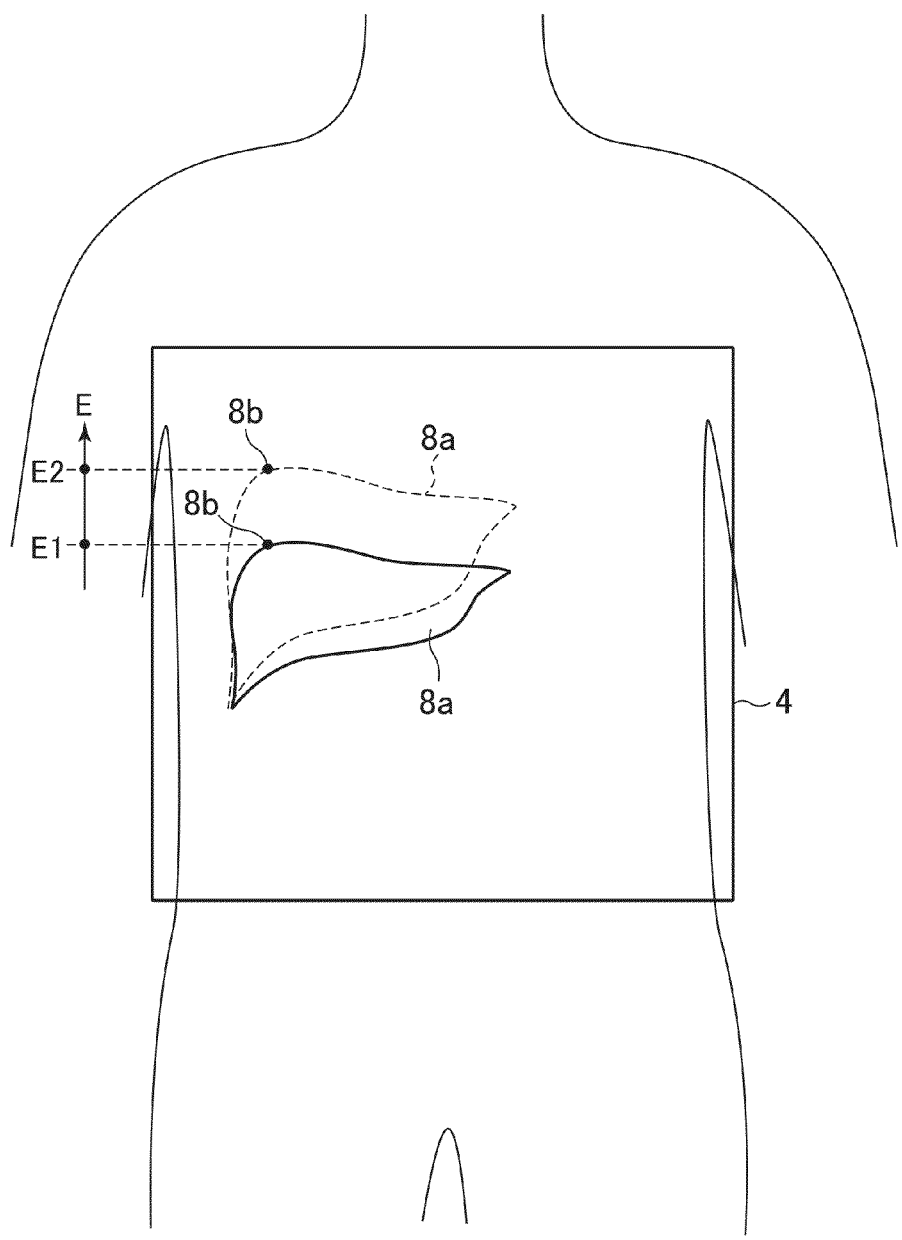
FIG. 2 is a diagram for explaining a position where a receiving coil 4 is attached.

FIG. 2 is a diagram for explaining a position where the receiving coil 4 is attached.

A region to be imaged in the present embodiment corresponds to each of a liver 8a and its peripheral regions. Thus, the receiving coil 4 is attached to a position close to the liver 8a. In FIG. 2, the liver 8a placed in a most contracted state is indicated by a solid line, and the liver 8a placed in a most expanded state is indicated by a broken line. When the liver 8a is most contracted, the edge 8b of the liver 8a is placed at the lower or undermost point E1. When the liver 8a is most expanded, the edge of the liver 8a is placed at the highest or uppermost point E2.

An MR (Magnetic Resonance) signal received by the receiving coil 4 is transmitted to the control device 5.

The control device 5 has a sequencer 51 through a central processing unit 55.

The sequencer 51 transmits information for executing a navigator sequence for determining an amount of displacement of the liver 8a and an imaging sequence for acquiring data in a k space from the subject 8 to the transmitter 52 and the gradient magnetic field power supply 53 under the control of the central processing unit 55. Described concretely, the sequencer 51 transmits, under the control of the central processing unit 55, information (center frequency, band width, etc.) about RF pulses of the navigator sequence and the imaging sequence to the transmitter 52 and sends information (intensity of gradient magnetic field or the like) about a gradient magnetic field to the gradient magnetic field power supply 53.

The transmitter 52 outputs a drive signal for driving the RF coil 24, based on the information sent from the sequencer 51.

The gradient magnetic field power supply 53 outputs a drive signal for driving the gradient coil 23, based on the information sent from the sequencer 51.

The receiver 54 signal-processes a magnetic resonance signal received by the receiving coil 4 and transmits it to the central processing unit 55.

The central processing unit 55 generally performs operations of respective parts of the MRI apparatus 1 so as to realize various operations of the MRI apparatus 1, such as transmission of information necessary for the sequencer 51 and the display device 7, reconstruction of an image based on the signal received from the receiver 54, etc. The central processing unit 55 is configured by a computer, for example. The central processing unit 55 functions as an image data calculation device and a displacement amount calculation device by executing predetermined programs.

The input device 6 transmits various instructions or the like to the control device 5 in response to the operation of an operator 9.

The display device 7 displays an image or the like thereon.

The magnetic resonance imaging apparatus 1 is configured in the above-described manner.

The imaging sequence used to acquire k-space data from the subject 8 will next be explained.

FIG. 3 is a diagram showing one example of the imaging sequence used to acquire the data in the k space from the subject 8.

In the present embodiment, the imaging sequence PS is of a gradient echo sequence. The imaging sequence PS may make use of another sequence such as a spin echo sequence or the like. The direction of phase encoding of the imaging sequence PS corresponds to, for example, a horizontal direction of a subject. The number of steps N for phase encoding is for example, N=128.

In the present embodiment, the subject 8 is imaged or captured by executing a navigator sequence NAV for measuring the amount of displacement of the liver 8a in addition to the imaging sequence PS. A description will next be made of how the MRI apparatus 1 executes the navigator sequence NAV and the imaging sequence PS.

FIGS. 4A-4C are diagrams for explaining how to execute the navigator sequence NAV and the imaging sequence PS.

FIG. 4A is a diagram showing motion of the edge of the liver 8a, FIG. 4B is a diagram showing the order of executing the navigator sequence NAV and the imaging sequence PS, and FIG. 4C is a diagram schematically showing k-space data S (t, n) obtained by executing the imaging sequence PS, respectively.

The liver 8a is deformed by the respiration of the subject 8. At this time, the edge 8b (refer to FIG. 2) of the liver 8a is displaced between the lowest point E1 and the highest point E2. A navigator sequence $NAV_p$ (where p=integers of 1 to m) is of a sequence for detecting the position of the edge 8b of the liver 8a to thereby determine the amount of displacement of the liver 8a, for example, a sequence using pencil beam excitation. After the navigator sequence $NAV_p$, an imaging sequence PS for acquiring k-space data from an imaging region including the liver 8a is executed. The navigator sequence $NAV_p$ and the imaging sequence PS are alternately executed. FIG. 4A schematically shows the shape of the liver when the imaging sequence PS is being executed. In the present embodiment, an imaging sequence PS for an n (where n=integers of 1 to N)th phase encoding is executed after the execution of the navigator sequence $NAV_p$. Data S (t, n) for an nth line in the k space are acquired by executing the imaging sequence PS for the nth phase encoding (refer to FIG. 4C). Data S (1, 1) through S (T, 1) for a first line in the k space are acquired by executing an imaging sequence PS for a first phase encoding, for example. Data S (1, N) through S (T, N) for an Nth line in the k space are acquired by executing an imaging sequence PS for an Nth phase encoding. The imaging sequences PS for the first, second, third, fourth and Nth phase encodings are shown in FIG. 4B.

According to the present embodiment, an MR image reduced in body-motion artifact due to the respiration can be acquired in a short period of time. This reason will be explained below with reference to FIGS. 5 through 9.

FIG. 5A is a diagram showing two deformed states of an imaging region, and FIG. 5B is a diagram showing an equation for defining a relationship of the two deformed states of the imaging region shown in FIG. 5A.

An image F (an image formed when an imaging region is deformed to a predetermined state, e.g. an image of an imaging region at the time that the edge 8b of the liver 8a is located at the lowest point E1 (refer to FIG. 2)) that one actually desires as an image of the imaging region is shown on the right side of FIG. 5A. On the other hand, an image Gn of an imaging region at an nth phase encoding is shown on the left side of FIG. 5A.

The image F is represented by a pixel f (x, y) at a coordinate (x, y). Assuming that the range of x is $x=x_1$ through $x_\alpha$ and the range of y is $y=y_1$ through $y_\alpha$, the image F is represented by $\alpha+\alpha$ pixels f $(x_1, y_1)$ through f $(x_\alpha, y_\alpha)$.

The image Gn is represented by a pixel gn (x', y') at the coordinate (x, y). Assuming that the range of x is $x=x_{1'}$ through $x_{\alpha'}$ and the range of y is $y=y_{1'}$ through $y_{\alpha'}$, the image Gn is represented by $\alpha+\alpha$ pixels gn $(x_{1'}, y_{1'})$ through gn $(x_{\alpha'}, y_{\alpha'})$.

Here, the pixels gn $(x_{1'}, y_{1'})$ through gn $(x_{\alpha'}, y_{\alpha'})$ of the image Gn can be expressed in the equation (1) shown in FIG. 5B using the pixels f $(x_1, y_1)$ through f $(x_\alpha, y_\alpha)$ of the image F. However, a matrix An in the equation (1) is of a matrix that defines a relationship between the image Gn and the image F.

When the pixels gn $(x_{1'}, y_{1'})$ through gn $(x_{\alpha'}, y_{\alpha'})$ are generalized by gn (x', y') and the pixels f $(x_1, y_1)$ through f $(x_\alpha, y_\alpha)$ are generalized by f (x, y), the equation (1) is represented by the following equation (2):

$$g_n(x', y') = \sum_{x,y} A_n(x', y'; x, y) f(x, y) \quad (2)$$

where $A_n (x', y'; x, y)$: element of matrix $A_n$.

Fourier-transforming $g_n (x', y')$ of the equation (2) yields k-space data $S (n, t)$ of an imaging region at the time that the nth phase encoding has been executed (refer to the following equation 3).

$$S(t, n) = \sum_{x',y'} K(t, n; x', y') \sum_{x,y} A_n(x', y'; x, y) f(x, y) \quad (3)$$
$$= \sum_{x,y} \left[ \sum_{x',y'} K(t, n; x', y') A_n(x', y'; x, y) \right] f(x, y)$$
$$= \sum_{x,y} Ka(t, n; x, y) f(x, y)$$

where $K(t, n; x', y')$ is Kernel of Fourier transformation $$Ka(t, n; x, y) = \sum_{x',y'} K(t, n; x'y') A_n(x', y'; x, y) \quad (4)$$

When the equation (3) is expressed in matrix notation, it is represented by the following equation (5):

$$\begin{bmatrix} S(1,1) \\ S(2,1) \\ M \\ S(T-1,N) \\ S(T,N) \end{bmatrix} = \quad (5)$$

$$\begin{bmatrix} Ka(1,1;x_1,y_1) \wedge \wedge \wedge Ka(1,1;x_a,y_a) \\ M \\ Ka(T,N;x_1,y_1) \wedge Ka(T,N;x_a y_a) \end{bmatrix} \begin{bmatrix} f(x_1,y_1) \\ f(x_2,y_1) \\ M \\ f(x_{a-1},y_a) \\ f(x_a,y_a) \end{bmatrix}$$

When the equation (5) is simplified, it is expressed in the following equation (6):

$$S = Ka \times f \quad (6)$$

where $S$, $Ka$ and $f$ respectively indicate vectors or matrices defined by the following equations (7) through (9):

$$\begin{bmatrix} S(1,1) \\ S(2,1) \\ M \\ S(T-1,N) \\ S(T,N) \end{bmatrix} \quad (7)$$

$$\begin{bmatrix} Ka(1,1;x_1,y_1) \wedge \wedge \wedge Ka(1,1;x_a,y_a) \\ M \\ Ka(T,N;x_1,y_1) \wedge Ka(T,N;x_a y_a) \end{bmatrix} \quad (8)$$

$$f = \begin{bmatrix} f(x_1,y_1) \\ f(x_2,y_1) \\ M \\ f(x_{a-1},y_a) \\ f(x_a,y_a) \end{bmatrix} \quad (9)$$

The following equation (10) is obtained from the equation (6):

$$f = Ka^{-1} \times S \quad (10)$$

where $Ka^{-1}$ is an inverse matrix of $Ka$.

Thus, if an element of the inverse matrix $Ka^{-1}$ is expressed in $Ka^{-1} (x, y; t, n)$, then the equation (1) can be represented by the following equation (11):

$$f(x, y) = \sum_{t,n} Ka^{-1}(x, y; t, n) S(t, n) \quad (11)$$

Since $S (t, n)$ are k-space data in the equation (11), $S (t, n)$ are values recognizable if magnetic resonance signals are acquired from the subject 8. Thus, if the element $Ka^{-1} (x, y; t, n)$ of the inverse matrix $Ka^1$ can be determined, then the values of respective pixels $f (x, y)$ of the image F of the imaging region deformed to the predetermined state can be determined even though the k-space data are acquired when the imaging region is deformed to the state indicated by the image Gn. A procedure for determining the element $Ka^{-1} (x, y; t, n)$ of the inverse matrix $Ka^{-1}$ will be explained below.

Since the inverse matrix $Ka^{-1}$ is of an inverse matrix of the matrix Ka expressed in the equation (8), the element $Ka^{-1} (x, y; t, n)$ of the inverse matrix $Ka^{-1}$ can be determined if an element $Ka (t, n; x, y)$ of the matrix Ka is known. Since the element $Ka (t, n; x, y)$ of the matrix Ka is expressed in the equation (4), the element $Ka (t, n; x, y)$ of the matrix Ka is determined if $K (t, n; x', y')$ and $An (x', y'; x, y)$ of the right side of the equation (4) are known. It is therefore possible to determine the element $Ka^{-1} (x, y; t, n)$ of the inverse matrix $Ka^{-1}$. $K (t, n; x', y')$ of the equation (4) is a pre-recognizable value because of Kernel for the Fourier transformation. Thus, if $An (x', y'; x, y)$ is found, then the element $Ka^{-1} (x, y; t, n)$ of the inverse matrix $Ka^{-1}$ can be determined. One example of a method for determining $An (x', y'; x, y)$ will be explained below.

Figure 6A:
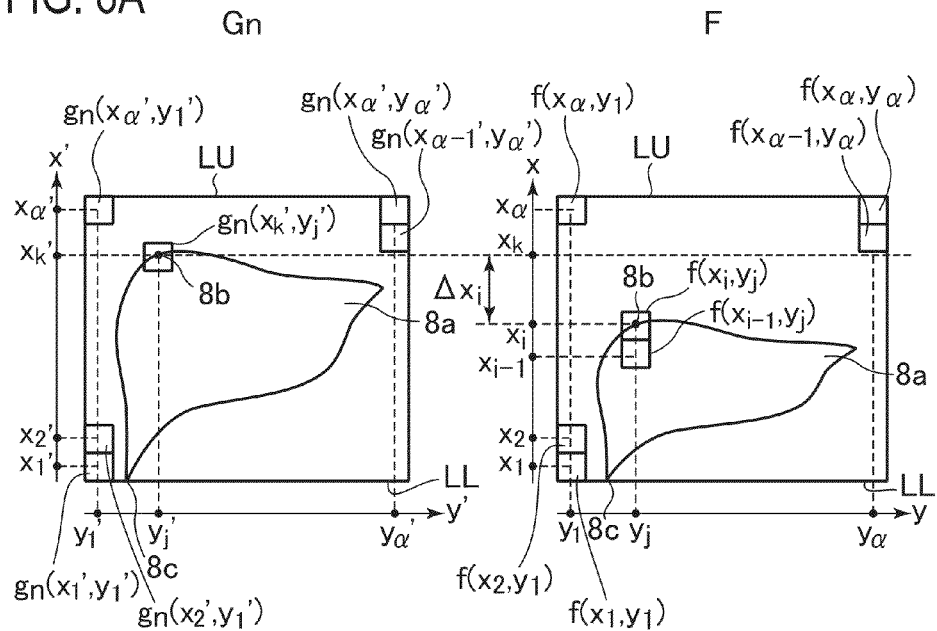
FIGS. 6A and 6B are diagrams for explaining one example of a method for calculating An (x', y'; x, y).
Figure 6B:
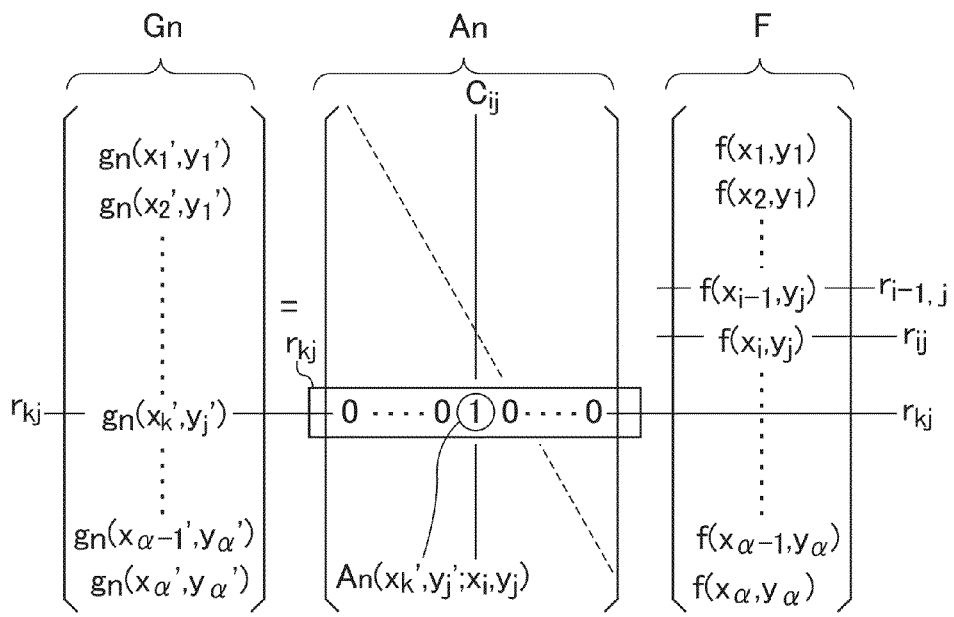

FIGS. 6A and 6B are diagrams showing one example of the method for calculating $An (x', y'; x, y)$.

FIG. 6A is a diagram showing the images Gn and F of the imaging region, and FIG. 6B is an equation indicative of the relationship between the image Gn, matrix An and image F.

Incidentally, the imaging region is assumed to be deformed in the below-described manner for convenience of explanation.

(1) A lower end LL of the imaging region is not displaced; and (2) The imaging region expands and contracts only in an x direction (x' direction).

The motion of the edge 8b of the liver 8a will first be considered with reference to FIG. 6A.

In the image F, the edge 8b of the liver 8a is located at a pixel $f (x_i, y_j)$. Since, however, the liver 8a expands and contracts in the x direction, the edge 8b of the liver 8a is displaced to a pixel $gn (x_k, y_{j'})$ in the image Gn of the imaging region at an nth phase encoding. In this case, the amount of displacement $\Delta x_i$ of the edge 8b of the liver 8a is expressed in the following equation (12):

$$\Delta x_i = x_k - x_i \qquad (12)$$

When $\Delta x_i = 4$, for example, it represents that the edge 8b of the liver 8a is displaced by four pixels. The pixel f ($x_i$, $y_j$) of the image F exists in a position shifted by the four pixels from the pixel gn ($x_{k'}$, $y_{j'}$) of the image Gn. Thus, the pixel gn ($x_{k'}$, $y_{j'}$) of the image Gn is considered to be equal to the pixel f ($x_i$, $y_j$) of the image F. Namely, gn ($x_{k'}$, $y_{j'}$) and f ($x_i$, $y_j$) are expressed in the following equation (13):

$$gn(x_{k'}, y_{j'}) = f(x_i, y_j) \qquad (13)$$

In order to establish the equation (13), only an element An ($x_{k'}$, $y_{j'}$; $x_i$, $y_j$) in elements contained in a row $r_{kj}$ of the matrix An may be defined as "1", and all the remaining elements may be defined as "0 (zero)", as shown in FIG. 6(b). Accordingly, the values of all the elements contained in the row $r_{kj}$ of the matrix An can be determined.

Incidentally, FIGS. 6A and 6B explain the case where the amount of displacement $\Delta x_i$ is an integer. However, the amount of displacement $\Delta x_i$ does not necessarily reach the integer. A description will be made below of how the elements contained in the row $r_{kj}$ of the matrix An are calculated where the amount of displacement $\Delta x_i$ is not brought to the integer.

Figure 7A:
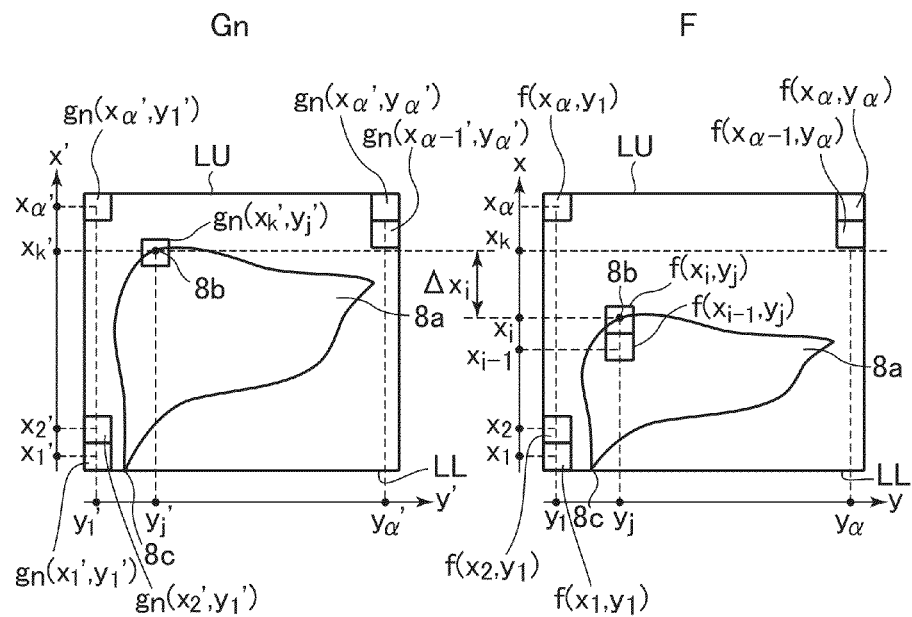
FIGS. 7A and 7B are diagrams for explaining one example of a method for calculating elements contained in a row $r_{kj}$ of a matrix An where a displacement amount $\Delta x_i$ is not brought to an integer.
Figure 7B:
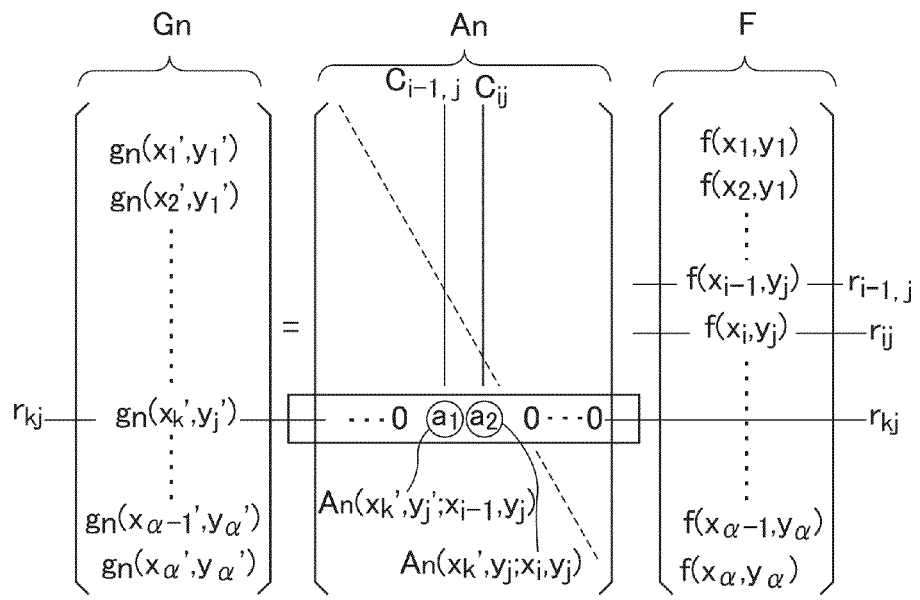

FIGS. 7A and 7B are diagrams for explaining one example of a method for calculating the elements contained in the row $r_{kj}$ of the matrix An where the amount of displacement $\Delta x_i$ is not brought to the integer.

When the amount of displacement $\Delta x_i = 6.4$, for example, it represents that the edge 8b of the liver 8a is displaced by 6.4 pixels. This device that the amount of displacement of the edge 8b of the liver 8a is larger than six pixels but smaller than seven pixels. The pixel f ($x_i$, $y_j$) of the image F exists in a position shifted by the six pixels from the pixel gn ($x_{k'}$, $y_{j'}$) of the image Gn. A pixel f ($x_{i-1}$, $y_j$) of the image F exists in a position shifted by seven pixels from the pixel gn ($x_{k'}$, $y_{j'}$) of the image Gn. Thus, the pixel gn ($x_{k'}$, $y_{j'}$) of the image Gn is considered to be representable using the pixel f ($x_i$, $y_j$) and f ($x_{i-1}$, $y_j$) of the image F. Namely, the pixel gn ($x_{k'}$, $y_{j'}$) of the image Gn is represented by the following equation using the pixel f ($x_i$, $y_j$) and f ($x_{i-1}$, $y_j$) of the image F:

$$gn(x_{k'}, y_{j'}) = a1 \cdot f(x_{i-1}, y_j) + a2 \cdot f(x_i, y_j) \qquad (14)$$

In order to establish the equation (14), an element An ($x_{k'}$, $y_{j'}$; $x_{i-1}$, $y_j$) in the elements contained in the row $r_{kj}$ of the matrix An may be defined as "a1", an element An ($x_{k'}$, $y_{j'}$; $x_i$, $y_j$) therein may be defined as "a2", and all the remaining elements may be defined as "0 (zero)". Accordingly, the values of all elements contained in the row $r_{kj}$ of the matrix An can be determined. The values of a1 and a2 can be determined based on, for example, the value of the amount of displacement $\Delta x_i$ (for example, a1=0.4 and a2=0.6).

It is understood from the explanations of FIGS. 6A, 6B, 7A, and 7B that if the amount of displacement $\Delta x_i$ is found, then the elements contained in the row $r_{kj}$ of the matrix An can be calculated. Since the navigator sequence NAVp is executed immediately before the execution of the imaging sequence PS in the present embodiment (refer to FIG. 4), the value of the displacement amount $\Delta x_i$ can be calculated from navigator echoes. A method for calculating the amount of displacement $\Delta x_i$ will be explained below.

Figure 8A:
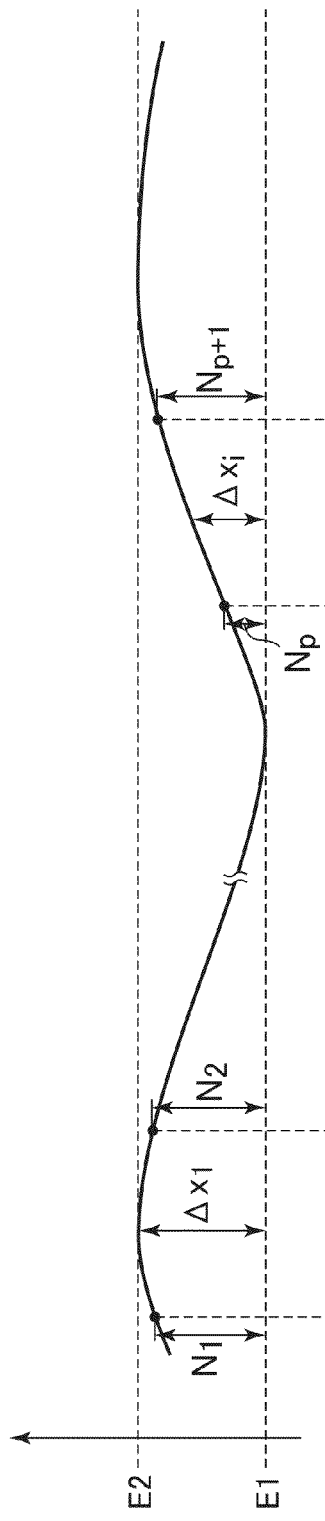
FIGS. 8A and 8B are diagrams for describing a method for calculating a displacement amount $\Delta x_i$.
Figure 8B:

FIGS. 8A and 8B are diagrams for explaining the method of calculating the amount of displacement $\Delta x_i$.

The amount of displacement $\Delta x_i$ of the edge 8b of the liver 8a at the imaging sequence PS for the nth phase encoding can be calculated using the following equation (15), for example:

$$\Delta x_i = (N_p + N_{p+1})/2 \qquad (15)$$

where $N_p$: position of the edge 8b of the liver 8a, which has been calculated by a navigator sequence $NAV_p$, and $N_{p+1}$: position of the edge 8b of the liver 8a, which has been calculated by a navigator sequence $NAV_{p+1}$.

When the equation (15) is used, the amount of displacement $\Delta x_1$ of the edge 8b of the liver 8a at the imaging sequence PS for the first phase encoding is expressed in the following equation (16):

$$\Delta x_1 = (N_1 + N_2)/2 \qquad (16)$$

where $N_1$: position of the edge 8b of the liver 8a, which has been calculated by a navigator sequence $NAV_1$, and $N_2$: position of the edge 8b of the liver 8a, which has been calculated by a navigator sequence $NAV_2$.

Incidentally, the method of calculating the amount of displacement $\Delta x_i$ is not limited to the equation (15). When, for example, the respiratory cycle of the subject is sufficiently longer than a repetition time TR of a pulse sequence, the following equation can be used:

$$\Delta x_i = N_p \qquad (17)$$

When the equation (17) is used, the amount of displacement $\Delta x_1$ of the edge 8b of the liver 8a at the imaging sequence PS for the first phase encoding is expressed in the following equation:

$$\Delta x_1 = N_p \qquad (18)$$

Thus, since the amount of displacement $\Delta x_i$ of the edge 8b of the liver 8a at the imaging sequence PS for the nth phase encoding can be calculated, the elements contained in the row $r_{kj}$ of the matrix An can be calculated as shown in FIGS. 6B and 7B.

If the amount of displacement $\Delta x_i$ of the edge 8b of the liver 8a is found, then elements contained in other rows other than the row $r_{kj}$ of the matrix An can also be calculated. A procedure for determining an element contained in a row $r_{pq}$ as a row other than the row $r_{kj}$ of the matrix An will be explained below with reference to FIGS. 9A and 9B.

Figure 9A:
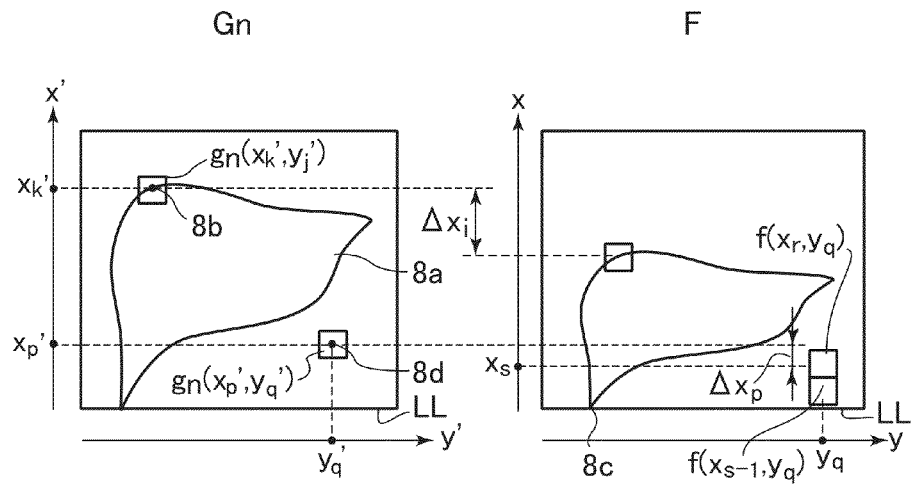
FIGS. 9A and 9B are diagrams for explaining a procedure for determining elements contained in a row $r_{pq}$ of a matrix An.
Figure 9B:
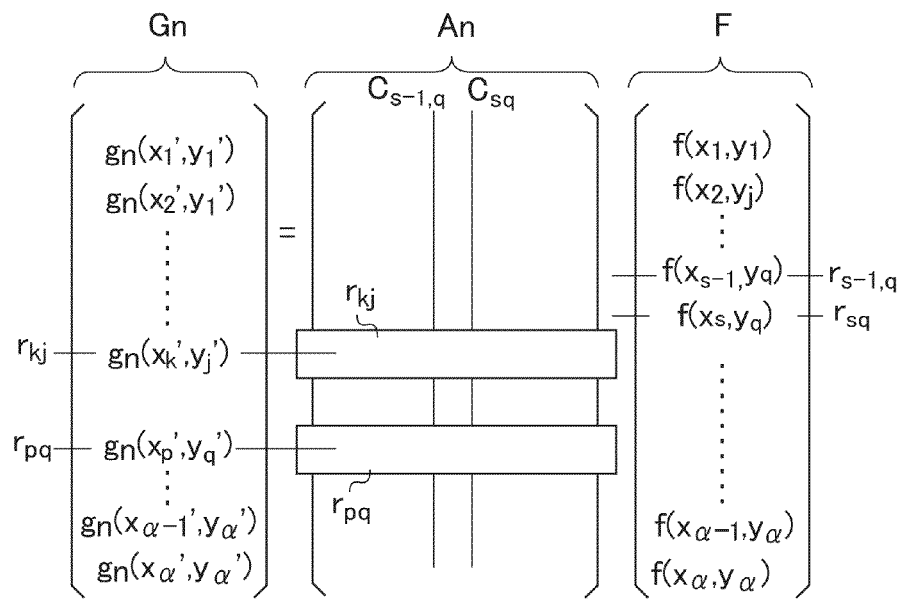

FIGS. 9A and 9B are diagrams for describing the procedure for determining each element contained in the row $r_{pq}$ of the matrix An.

Assuming that the amount of expansion/contraction at a coordinate (x', y') (or coordinate (x, y)) of the imaging region is proportional to the value of an x' coordinate (or x coordinate)), the amount of displacement $\Delta x_p$ of a region 8d of the imaging region can be expressed in the following equation:

$$\Delta x_p = (x_{p'}/x_{k'}) \cdot \Delta x_j \qquad (19)$$

The amount of displacement $\Delta x_i$ of the equation (19) is of a value determined from navigator echoes, and each of $x_{p'}$ and $x_{k'}$ is of an already-known value because of the value of the x' coordinate. Thus, if the amount of displacement $\Delta x_i$ is found, then the amount of displacement $\Delta x_p$ can be determined. A pixel gn ($x_{p'}$, $x_{q'}$) of the image Gn can be expressed in the following equation (21) or (22) according to the value of the amount of displacement $\Delta x_p$:

$$gn(x_{p'}, y_{1'}) = f(x_s, y_q) \qquad (21)$$

$$gn(x_{p'}, y_{q'}) = b1 \cdot f(x_{s-1}, y_q) + b2 \cdot (x_s, y_q) + \qquad (22)$$

Thus, the element contained in the row $r_{pq}$ of the matrix An can be determined from the equation (21) or (22). Elements contained in other rows other than the row $r_{pq}$ can also be determined in a like procedure. It is thus possible to calculate the values of all elements of the matrix An.

Since the value of the element An (x', y'; x, y) of the matrix An can be determined as explained with reference to FIGS. 6 through 9, the element Ka (t, n; x, y) of the matrix Ka is calculated by substituting the value of the determined element An (x', y'; x, y) of matrix An into the equation (4). Thus, since the element $Ka^{-1}$ (x, y; t, n) of the inverse matrix $Ka^{-1}$ can also be calculated, the values of the respective pixels f (x, y) of the image F can be calculated in accordance with the equation (11).

In the present embodiment as described above, the values of the respective pixels f (x, y) of the image F of the imaging region deformed to the predetermined state can be determined even though the k-space data are acquired when the imaging region is deformed to the state indicated by the image Gn. There is thus no need to wait for the deformation of the imaging region to the predetermined state (image F) when the k-space data are acquired, thereby making it possible to shorten the imaging time.

A processing flow of the MRI apparatus 1 at the time that the data about the image F are calculated will next be explained.

Figure 10:
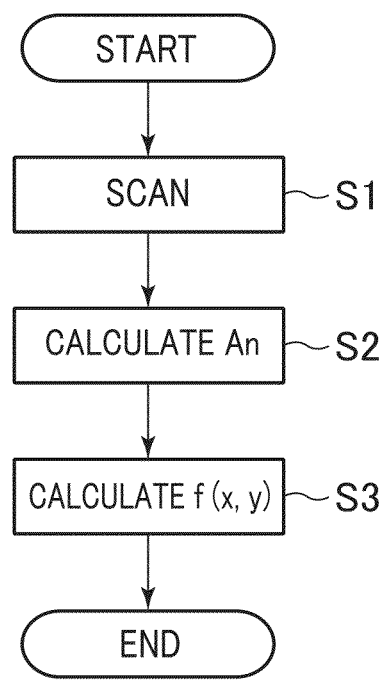
FIG. 10 is a diagram showing one example of a processing flow of the MRI apparatus 1.

FIG. 10 is a diagram showing one example of the processing flow of the MRI apparatus 1.

Incidentally, a description about FIG. 10 will be made with reference to FIG. 1.

At Step S1, the operator 9 operates the input device 6 to input an imaging instruction for imaging or capturing the subject 8. When the imaging instruction is inputted, the sequencer 51 transmits information (information on RF pulse, information on gradient magnetic field) for executing the navigator sequence NAV and the imaging sequence PS (refer to FIGS. 4A-4C) to the transmitter 52 and the gradient magnetic field power supply 53 under the control of the central processing unit 55. Consequently, a magnetic resonance signal is generated from the subject 8. The magnetic resonance signal is received by the receiving coil 4 and transmitted to the receiver 54. Thus, the k-space data S (t, n) are acquired from the subject 8.

After the acquisition of the k-space data S (t, n), the processing flow proceeds to Step S2.

At Step S2, the amount of displacement $\Delta x_i$ (refer to, for example, FIG. 6(a)) of the edge 8b of the liver 8a is calculated from navigator echoes obtained by the navigator sequence $NAV_p$. The element An (x', y'; x, y) of the matrix An is calculated based on the calculated amount of displacement $\Delta x_i$ in accordance with the procedure described with reference to FIGS. 6 through 9. After the calculation of the An (x', y'; x, y), the processing flow proceeds to Step S3.

At Step S3, the element $Ka^{-1}$ (x, y; t, n) of the inverse matrix $Ka^{-1}$ is calculated from the element An (x', y'; x, y) of the matrix An, which has been calculated at Step S2. Then, the calculated element $Ka^{-1}$ (x, y; t, n) of inverse matrix $Ka^{-1}$ and the k-space data S (t, n) acquired at Step S1 are substituted into the equation (11). It is thus possible to obtain data about an image F that one wants.

Simulations for examining how, when the subject 8 is imaged by the method of the present embodiment, ghosts that appear in a phase direction due to its body motion change were performed. Simulation results will be explained below with reference to FIGS. 11 and 12.

Figure 11:
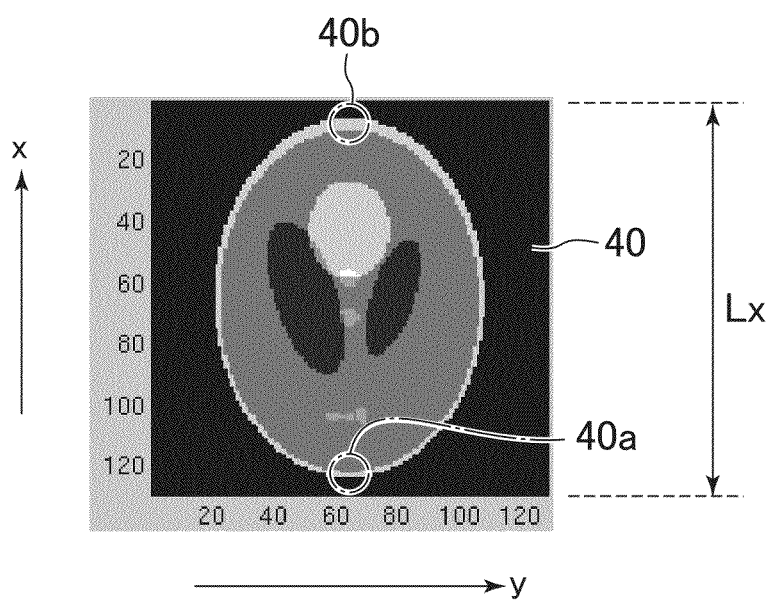
FIG. 11 is a diagram showing an original image 40 used in simulation.

FIG. 11 is a diagram showing an original image 40 used in simulation.

Simulation conditions are as follows:

(1) A lower end 40a of the original image 40 corresponds to a non-displaced fixed end.

(2) The original image 40 uniformly expands and contracts in an x direction.

(3) An upper end 40b of the original image 40 is displaced up to 10% of the length Lx of a field of view FOV at maximum.

(4) A phase encoding direction corresponds to a y direction.

(5) A detection error at the time that the upper end 40b of the original image 40 is detected by navigator echoes is 1% and 5% of the length Lx of the field of view FOV.

FIGS. 12A and 12B are diagrams showing simulation results.

FIG. 12A shows a simulation result where the detection error of the upper end 40b of the original image 40 is 1%, and FIG. 12B is a simulation result where the detection error of the upper end 40b of the original image 40 is 5%.

In FIGS. 12A and 12B, (a1) and (b1) are of images each free of body-motion correction, and (a2) and (b2) are of images obtained by the method of the present embodiment. (a3) and (b3) are diagrams showing actual positions (indicated by marks ○) of the upper end 40b of the original image 40, and positions (indicated by marks ☆) of the upper end 40b of the original image 40, which have been detected by a navigator.

It is understood that referring to FIGS. 12A and 12B, the ghosts are reduced by using the method of the present embodiment.

The liver 8a of the subject was actually imaged using the method of the present embodiment. Acquired MR images will be explained below.

FIGS. 13A and 13B are diagrams showing the MR images of the liver 8a of the subject.

FIG. 13A shows coronal images, and FIG. 13B shows sagittal images, respectively.

In FIGS. 13A and 13B, (a1) and (b1) are images free of body-motion correction, and (a2) and (b2) are images obtained by the method of the present embodiment.

It is understood that body-motion artifacts appear in the vicinity of the diaphragm where the body-motion correction is not performed ((a1) and (b1)), whereas body-motion artifacts in the vicinity of the diaphragm are reduced where the method of the present embodiment is used ((a2) and (b2)).

Incidentally, in the present embodiment, only one phase encoding is executed between the execution of the navigator sequence $NAV_p$ and the execution of the next navigator sequence $NAV_{p+1}$ (refer to FIG. 4B). In the invention, however, the phase encoding may be executed plural times between the execution of the navigator sequence $NAV_p$ and the execution of the next navigator sequence $NAV_{p+1}$. A description will be made below of an example in which the phase encoding is executed plural times.

Figure 14:
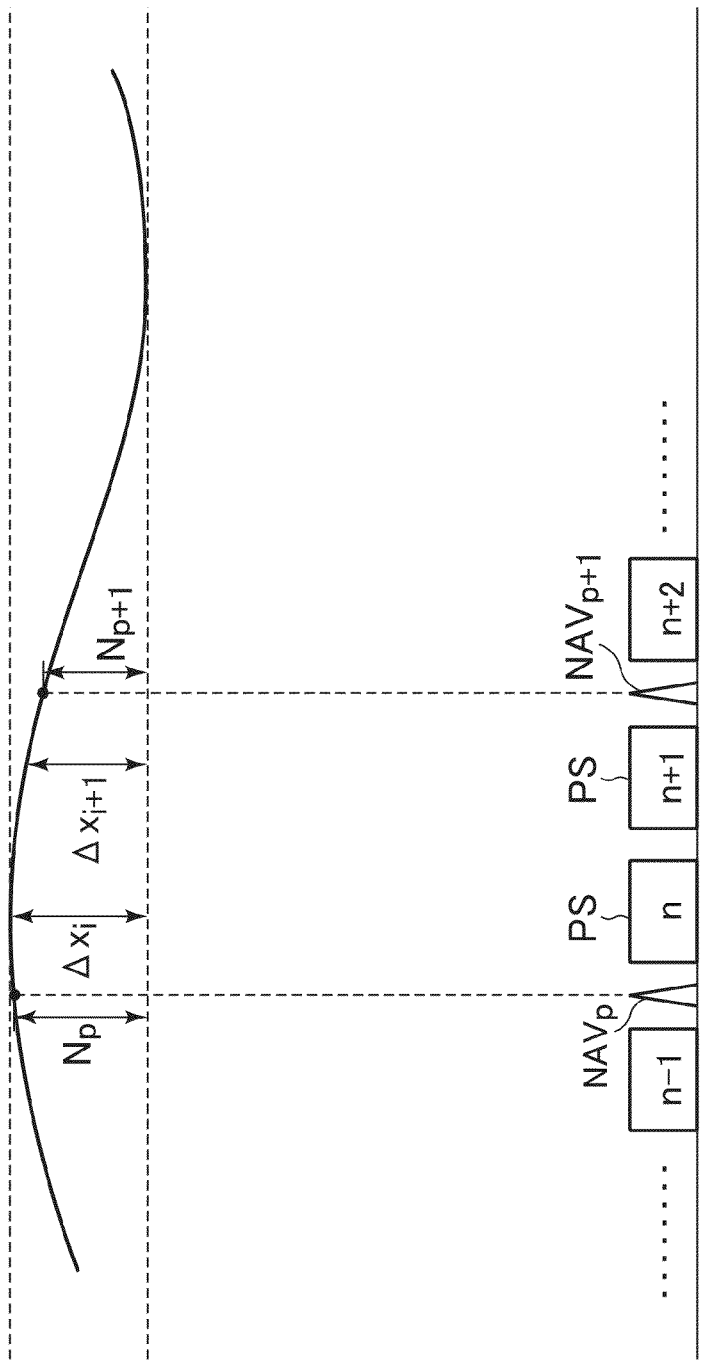
FIG. 14 is a diagram showing an example in which phase encoding is executed plural times.

FIG. 14 is a diagram showing the example in which the phase encoding is carried out plural times.

In FIG. 14, the phase encoding is performed twice between the execution of a navigator sequence $NAV_p$ (where p=integers of 1 to m) and the execution of the next navigator sequence $NAV_{p+1}$. In this case, the amount of displacement $\Delta x_i$ of the edge 8b of the liver 8a at an imaging sequence PS for an nth phase encoding, and the amount of displacement $\Delta x_{i+1}$ of the edge 8b of the liver 8a at an imaging sequence PS for an n+1th phase encoding can be represented by the following equations, for example:

$$\Delta x_i = k_{i,p} \cdot N_{p} + k_{i,p+1} \cdot N_{p+1} \tag{23}$$

$$\Delta x_{i+1} = k_{i+1,p} \cdot N_{p} + k_{i+1,p+1} \cdot N_{p+1} \tag{24}$$

where $k_{i,p}$, $k_{i,p+1}$, $k_{i+1,p}$, $k_{i+1,p+1}$: coefficients.

For example, the coefficients $k_{i,p} = 1/3$, $k_{i,p+1} = 2/3$, $k_{j+1,p} = 2/3$, and $k_{i+1,p+1} = 1/3$. Thus, since the amounts of displacement of the edge 8b of the liver 8a at the respective phase encodings can be calculated, an element An (x', y'; x, y) of a matrix An can be calculated, and data about an image F that one wants can be obtained. Although the phase encoding is performed twice between the navigator sequence $NAV_p$ and $NAV_{p+1}$ in FIG. 14, the phase encoding may be executed three or more times.

Incidentally, although the amount of displacement of the edge 8b of the liver 8a is calculated by the navigator echo method in the present embodiment, the amount of displacement of the edge 8b of the liver 8a may be calculated using bellows instead of the navigator echo method.

In the present embodiment, the element An (x', y'; x, y) of the matrix An is calculated based on the amount of displacement of the edge 8b of the liver 8a. The element An (x', y'; x, y) of the matrix An may however be calculated based on the amount of displacement of each portion or region other than the edge 8b of the liver 8a.

In the present embodiment, the navigator echoes are acquired from inside the imaging region of the subject. If, however, an image F sufficiently reduced in body-motion artifact can be obtained, then the navigator echoes may be acquired from each region that exists outside the imaging region.

Further, the present embodiment has explained the example in which the liver 8a is imaged or captured as the deformed region. The invention can however be applied even to a case in which other regions such as the heart, etc. are imaged.

Incidentally, in the present embodiment, the relationship between the imaging region (refer to the image F) deformed to the predetermined form and the imaging region (refer to the image Gn) at the n (where n=integers of 1 to N)th phase encoding has been defined by the element An (x', y'; x, y) of the matrix An. The relationship between the imaging region (refer to the image F) deformed to the predetermined form and the imaging region (refer to the image Gn) at the n (where n=integers of 1 to N)th phase encoding may be defined by another numeric value different from the element An (x', y'; x, y) of the matrix An.

Many widely different embodiments of the invention may be configured without departing from the spirit and the scope of the present invention. It should be understood that the present invention is not limited to the specific embodiments described in the specification, except as defined in the appended claims.

What is claimed is:

1. A magnetic resonance imaging apparatus for acquiring k-space data from a deformable imaging region of a subject and generating image data of the imaging region at the time of being deformed to a predetermined state, based on the acquired k-space data, said magnetic resonance imaging apparatus comprising:
a gradient coil configured to apply a gradient magnetic field in a phase encoding direction; and
an image data calculation device configured to:
calculate a numeric value for defining a relationship between the imaging region at the time of being deformed to the predetermined state and the imaging region at an nth phase encoding; and
calculate image data of the imaging region at the time of being deformed to the predetermined state, based on the calculated numeric value and the k-space data acquired from the imaging region, wherein the k-space data is acquired along lines that are parallel to a direction along which the imaging region deforms.

2. The magnetic resonance imaging apparatus according to claim 1, wherein the image data calculation device is configured to calculate an element of a matrix for defining the relationship between the imaging region at the time of being deformed to the predetermined state and the imaging region at the nth phase encoding and to calculate image data of the imaging region at the time of being deformed to the predetermined state, based on the calculated element of matrix and the k-space data acquired from the imaging region.

3. The magnetic resonance imaging apparatus according to claim 2, further comprising a displacement amount calculation device configured to calculate an amount of displacement of each portion in the imaging region, wherein said image data calculation device is configured to calculate an element of the matrix, based on the amount of displacement calculated by said displacement amount calculation device.

4. The magnetic resonance imaging apparatus according to claim 3, wherein said displacement amount calculation device is configured to calculate the amount of displacement of each portion in the imaging region, based on navigator echoes acquired from the subject.

5. The magnetic resonance imaging apparatus according to claim 4, wherein said magnetic resonance imaging apparatus is configured to execute a navigator sequence for acquiring the navigator echoes and an imaging sequence for acquiring the k-space data from the imaging region.

6. The magnetic resonance imaging apparatus according to claim 5, wherein said magnetic resonance imaging apparatus is configured to perform phase encoding once with respect to the imaging sequence by the time that the next navigator sequence is executed after the navigator sequence has been executed.

7. The magnetic resonance imaging apparatus according to claim 5, wherein said magnetic resonance imaging apparatus is configured to repeatedly perform phase encoding with respect to the imaging sequence by the time that the next navigator sequence is executed after the navigator sequence has been executed.

8. The magnetic resonance imaging apparatus according to claim 3, wherein said displacement amount calculation device is configured to calculate the amount of displacement of a predetermined portion in the imaging region and to calculate respective amounts of displacement of the remaining portions therein, based on the calculated amount of displacement of the predetermined portion.

9. The magnetic resonance imaging apparatus according to claim 4, wherein said displacement amount calculation device is configured to calculate the amount of displacement of a predetermined portion in the imaging region and to calculate respective amounts of displacement of the remaining portions therein, based on the calculated amount of displacement of the predetermined portion.

10. The magnetic resonance imaging apparatus according to claim 5, wherein said displacement amount calculation device is configured to calculate the amount of displacement of a predetermined portion in the imaging region and to calculate respective amounts of displacement of the remaining portions therein, based on the calculated amount of displacement of the predetermined portion.

11. The magnetic resonance imaging apparatus according to claim 6, wherein said displacement amount calculation device is configured to calculate the amount of displacement of a predetermined portion in the imaging region and to calculate respective amounts of displacement of the remaining portions therein, based on the calculated amount of displacement of the predetermined portion.

12. The magnetic resonance imaging apparatus according to claim 7, wherein said displacement amount calculation device is configured to calculate the amount of displacement of a predetermined portion in the imaging region and to calculate respective amounts of displacement of the remaining portions therein, based on the calculated amount of displacement of the predetermined portion.

13. The magnetic resonance imaging apparatus according to claim 8, wherein the predetermined portion in the imaging region is of an edge of a liver.

14. The magnetic resonance imaging apparatus according to claim 9, wherein the predetermined portion in the imaging region is of an edge of a liver.

15. The magnetic resonance imaging apparatus according to claim 10, wherein the predetermined portion in the imaging region is of an edge of a liver.

16. The magnetic resonance imaging apparatus according to claim 11, wherein the predetermined portion in the imaging region is of an edge of a liver.

17. The magnetic resonance imaging apparatus according to claim 12, wherein the predetermined portion in the imaging region is of an edge of a liver.

18. The magnetic resonance imaging apparatus according to claim 3, wherein said displacement amount calculation device is configured to calculate the amount of displacement of each portion in the imaging region using bellows.

19. A magnetic resonance imaging method for acquiring k-space data from a deformable imaging region of a subject and generating image data of the imaging region at the time of being deformed to a predetermined state, based on the acquired k-space data, said method comprising:
    applying a gradient magnetic field in a phase encoding direction;
    calculating a numeric value for defining a relationship between the imaging region at the time of being deformed to the predetermined state and the imaging region at an nth phase encoding; and
    calculating image data of the imaging region at the time of being deformed to the predetermined state, based on the calculated numeric value and the k-space data acquired from the imaging region, wherein the k-space data is acquired along lines that are parallel to a direction along which the imaging region deforms.

20. The method of a magnetic resonance imaging according to claim 19, further comprising calculating an element of a matrix for defining the relationship between the imaging region at the time of being deformed to the predetermined state and the imaging region at the nth phase encoding and calculating image data of the imaging region at the time of being deformed to the predetermined state, based on the calculated element of matrix and the k-space data acquired from the imaging region.

* * * * *